(12) United States Patent
Endoh et al.

(10) Patent No.: US 12,141,026 B2
(45) Date of Patent: Nov. 12, 2024

(54) ERROR CORRECTION CIRCUIT, ERROR CORRECTION METHOD, AND COMMUNICATION APPARATUS

(71) Applicant: NTT ELECTRONICS CORPORATION, Yokohama (JP)

(72) Inventors: Yasuyuki Endoh, Yokohama (JP); Masaaki Iizuka, Yokohama (JP)

(73) Assignee: NTT ELECTRONICS CORPORATION, Yokohama (JP)

( * ) Notice: Subject to any disclaimer, the term of this patent is extended or adjusted under 35 U.S.C. 154(b) by 0 days.

(21) Appl. No.: 18/250,268

(22) PCT Filed: Oct. 1, 2021

(86) PCT No.: PCT/JP2021/036421
§ 371 (c)(1),
(2) Date: Apr. 24, 2023

(87) PCT Pub. No.: WO2022/091692
PCT Pub. Date: May 5, 2022

(65) Prior Publication Data
US 2024/0020193 A1 Jan. 18, 2024

(30) Foreign Application Priority Data
Oct. 26, 2020 (JP) .................. 2020-178852

(51) Int. Cl.
*G06F 11/10* (2006.01)
(52) U.S. Cl.
CPC .................... *G06F 11/10* (2013.01)
(58) Field of Classification Search
CPC ....... G06F 11/10; H03M 13/19; H03M 13/29; H04L 1/00
See application file for complete search history.

(56) References Cited

U.S. PATENT DOCUMENTS

| 6,434,719 B1 | 8/2002 | Livingston |
| 2006/0053362 A1 | 3/2006 | Uchida et al. |
| (Continued) | | |

FOREIGN PATENT DOCUMENTS

| JP | 2000-201085 A | 7/2000 |
| JP | 2006-074656 A | 3/2006 |
| (Continued) | | |

OTHER PUBLICATIONS

International Preliminary Report on Patentability received for PCT Patent Application No. PCT/JP2021/036421, mailed on May 11, 2023, 9 pages (6 pages of English Translation and 3 pages of Original Document).

(Continued)

*Primary Examiner* — Thien Nguyen
(74) *Attorney, Agent, or Firm* — WOMBLE BOND DICKINSON (US) LLP (57) ABSTRACT

An error correction circuit (20) according to this invention includes a first error correction processing circuit (21) configured to perform error correction processing in a row direction on array data having undergone first coding in the row direction, an error detection processing circuit (26) configured to perform error detection processing in a column direction on the array data having undergone second coding in the column direction, a corrected-bit likelihood calculation circuit (24) configured to calculate for each row the sum of likelihoods of corrected bits each of which is a bit corrected by the first error correction processing circuit (21), a high-likelihood row detection circuit (25) configured to detect rows of the array data in the descending order of the sums of likelihoods of corrected bits of respective rows output from the corrected-bit likelihood calculation circuit (24), and a second error correction processing circuit (27) configured to correct a bit at which a column error-detected (Continued)

by the error detection processing circuit (26) and a row detected by the high-likelihood row detection circuit (25) cross each other. An error correction circuit capable of improving transmission characteristics while suppressing the circuit scale can be provided.

14 Claims, 6 Drawing Sheets

(56) References Cited

U.S. PATENT DOCUMENTS

| | | |
|---|---|---|
| 2011/0214029 A1 | 9/2011 | Steiner et al. |
| 2021/0089389 A1* | 3/2021 | Kaynak ............ H03M 13/3715 |

FOREIGN PATENT DOCUMENTS

| | | |
|---|---|---|
| JP | 2006-295510 A | 10/2006 |
| JP | 2013-165408 A | 8/2013 |
| JP | 2013-198140 A | 9/2013 |

OTHER PUBLICATIONS

International Search Report and Written Opinion received for PCT Patent Application No. PCT/JP2021/036421, mailed on Dec. 7, 2021, 11 pages (5 pages of English Translation and 6 pages of Original Document).

Office Action received for Japanese Patent Application No. 2020-178852, mailed on Nov. 25, 2021, 7 pages (3 pages of English Translation and 4 pages of Original Document).

* cited by examiner

ERROR CORRECTION CIRCUIT, ERROR CORRECTION METHOD, AND COMMUNICATION APPARATUS

TECHNICAL FIELD

The present invention relates to an error correction circuit, error correction method, and communication apparatus capable of improving transmission characteristics.

BACKGROUND ART

In coherent optical communication, distortion and frequency/phase fluctuations generated during transmission are compensated by digital signal processing to improve transmission characteristics. For further improved transmission characteristics, an error correction circuit is provided between transmission and reception to reduce data errors in transmission characteristics, in addition to the compensation function. The transmission characteristics are generally improved by performing error correction coding on data on the transmission side and performing error correction in accordance with the coding on the reception side.

As error correction methods, for example, Hamming coding, BCH coding, Reed-Solomon coding, and convolutional coding/Viterbi decoding are generally known well. Particularly in recent communication apparatuses, a massive amount of complicated processes become possible thanks to advanced computing power of the CPU, and high-performance error correction methods such as LDPC (Low-Density Parity-check Code) are used. In recent years, data are arrayed in n rows×m columns and error correction processing is performed on the data in the row and column directions to improve the correction capability, as in patent literatures 1 and 2.

Error correction processing includes hard decision in which correction processing is performed based on the result of decoding into "1" or "0", and soft decision in which correction processing is performed based on the coordinates (before decoding into "1" or "0") of a reception signal on the complex plane. The latter method enhances the correction capability in comparison with the former method, but increases the circuit and processing scales and the power consumption.

RELATED ART LITERATURE

Patent Literature

Patent Literature 1: Japanese Patent Laid-Open No. 2006-074656

Patent Literature 2: Japanese Patent Laid-Open No. 2006-295510

DISCLOSURE OF INVENTION

Problem to be Solved by the Invention

As described above, communication requiring high transmission characteristics needs to adopt the high-performance error correction method based on soft decision. This poses a problem that the circuit scale and the power consumption are increased. A data error is generated relatively at random with respect to thermal noise, but sometimes generated continuously with respect to polarization fluctuations and the like (burst error). Against the burst error, it is necessary to prolong the unit (code length) of coding or the unit (interleave length) of dispersing an error. This also increases the circuit scale and the power consumption.

The present invention has been made to solve the above drawbacks, and has as its object to provide an error correction circuit, error correction method, and communication apparatus capable of improving transmission characteristics while suppressing the circuit scale.

Means of Solution to the Problem

To solve the above-described problems, according to the present invention, there is provided an error correction circuit comprising a first error correction processing circuit configured to perform error correction processing in a row direction on array data having undergone first coding in the row direction on a transmission side, an error detection processing circuit configured to perform error detection processing in a column direction on the array data having undergone second coding in the column direction on the transmission side to detect an error of at least one bit, a corrected-bit likelihood calculation circuit configured to calculate a sum of likelihoods of corrected bits for each row, the corrected bit being a bit corrected by the first error correction processing circuit, and the likelihood being an index representing certainty of a bit, a high-likelihood row detection circuit configured to detect rows of the array data in a descending order of sums of likelihoods of corrected bits of respective rows output from the corrected-bit likelihood calculation circuit, and a second error correction processing circuit configured to, when the error detection processing circuit detects the error of at least one bit, correct a bit at which a column in which the error is detected and a row detected by the high-likelihood row detection circuit cross each other.

To solve the above-described problems, according to the present invention, there is provided an error correction circuit comprising a first error correction processing circuit configured to perform error correction processing in a row direction on array data having undergone first coding in the row direction on a transmission side, an error detection processing circuit configured to perform error detection processing in a column direction on the array data having undergone second coding in the column direction on the transmission side to detect an error of at least one bit, a corrected-bit likelihood calculation circuit configured to calculate a sum of likelihoods of corrected bits for each row, the corrected bit being a bit corrected by the first error correction processing circuit, and the likelihood being an index representing certainty of a bit, and a second error correction processing circuit configured to, when the error detection processing circuit detects the error of at least one bit, perform error correction in an order of the rows having larger sums of the likelihoods of corrected bits.

To solve the above-described problems, according to the present invention, there is provided an error correction method executed in an error correction circuit including a first error correction processing circuit, an error detection processing circuit, a second error correction processing circuit, and a corrected-bit likelihood calculation circuit, the method comprising steps of causing the first error correction processing circuit to perform error correction processing in a row direction on array data having undergone first coding in the row direction on a transmission side, causing the error detection processing circuit to perform error detection processing of at least one bit in a column direction on the array data having undergone second coding in the column direction on the transmission side, causing the corrected-bit likelihood calculation circuit to calculate a likelihood as an index representing certainty of a bit and calculate a sum of calculated likelihoods of corrected bits for each row of the array data, the corrected bit being a bit corrected by the first error correction processing circuit, and causing the second error correction processing circuit to, when the error detection processing circuit detects the error of at least one bit, correct a bit in an order of the rows having larger sums of the likelihoods of corrected bits.

Effect of the Invention

According to the present invention, an error correction circuit, error correction method, and communication apparatus capable of improving transmission characteristics while suppressing the circuit scale can be provided.

BEST MODE FOR CARRYING OUT THE INVENTION

A embodiment of the present invention will be described below with reference to the accompanying drawings. The present invention can be practiced in many different embodiments and should not be limited to the embodiment described below.

<Overview of Present Invention>

According to the present invention, the first error correction processing is performed in the row direction on array data having undergone coding (first coding) in the row direction on the transmission side, and the second error correction processing is performed by performing error detection in the column direction on array data having undergone coding (second coding) in the column direction on the transmission side. In the second error correction processing, the corrected-bit likelihood is calculated in regard to a bit corrected by the first error correction processing in the row direction, and a bit at which a column in which the error is detected and a row having a large corrected-bit likelihood cross each other is corrected. The corrected-bit likelihood is an index representing the certainty (reliability) of a bit of a reception signal, and is an index for estimating a row including a bit that could not be corrected or is highly likely to have been corrected erroneously in the first error correction processing. In this embodiment, "(sum of) likelihood is large" means that a bit could not be corrected or is highly likely to have been corrected erroneously. Note that "(sum of) likelihood is large" and "(sum of) likelihood is high" are synonymous. The likelihood can be reliability information.

According to the present invention, an error correction circuit capable of improving transmission characteristics while suppressing the circuit scale can be constituted by combining the first error correction having high correction capability and the second error correction using simple error detection.

On the transmission side, transmission data are arrayed in parallel, the first error correction coding (soft-decision error correction such as LDPC) having high correction capability is performed on data in the row direction, and coding (coding for detecting a single or plurality of errors, such as CRC check) for simple error detection is performed on data in the column direction. Note that the first error correction can employ a circuit scaled down by relatively shortening the code length.

On the reception side, array data similar to those on the transmission side are constituted, and the first error correction processing is performed on data in the row direction. In regard to an error-corrected bit in the first error correction processing, a predetermined number of rows are detected in the descending order of the sum of likelihoods serving as an index representing the certainty of a bit. For example, the likelihood can be calculated based on the absolute values of differences between the coordinates of a reception signal before error correction on the complex plane and those of a closest constellation among constellations set on the transmission side. In this case, as the coordinate difference is smaller on the complex plane, the likelihood is regarded to be higher, and a predetermined number of rows are detected in the ascending order of the sum of the absolute values of the coordinate differences. By detecting a predetermined number of rows in the descending order of the likelihood, it becomes possible to estimate a row that could not be corrected or is highly likely to have been corrected erroneously under a great influence of noise or the like in the first error correction processing on data in the row direction.

On the reception side, error detection is performed on data in the column direction after the first error correction processing. When an error is detected from the data in the column direction, the second error correction processing is performed on bits crossing the column in which the error is detected in the order of rows detected in the descending order of the likelihood.

According to the present invention, an error correction circuit capable of improving transmission characteristics while suppressing the circuit scale can be constituted by combining the first error correction having high correction capability and the second error correction using simple error detection. The circuit scale is reduced by shortening the code length in the first error correction, and the resultant degradation of the correction capability can be compensated by simpler second error correction.

<Communication Apparatus Including Error Correction Circuit>

Figure 1:
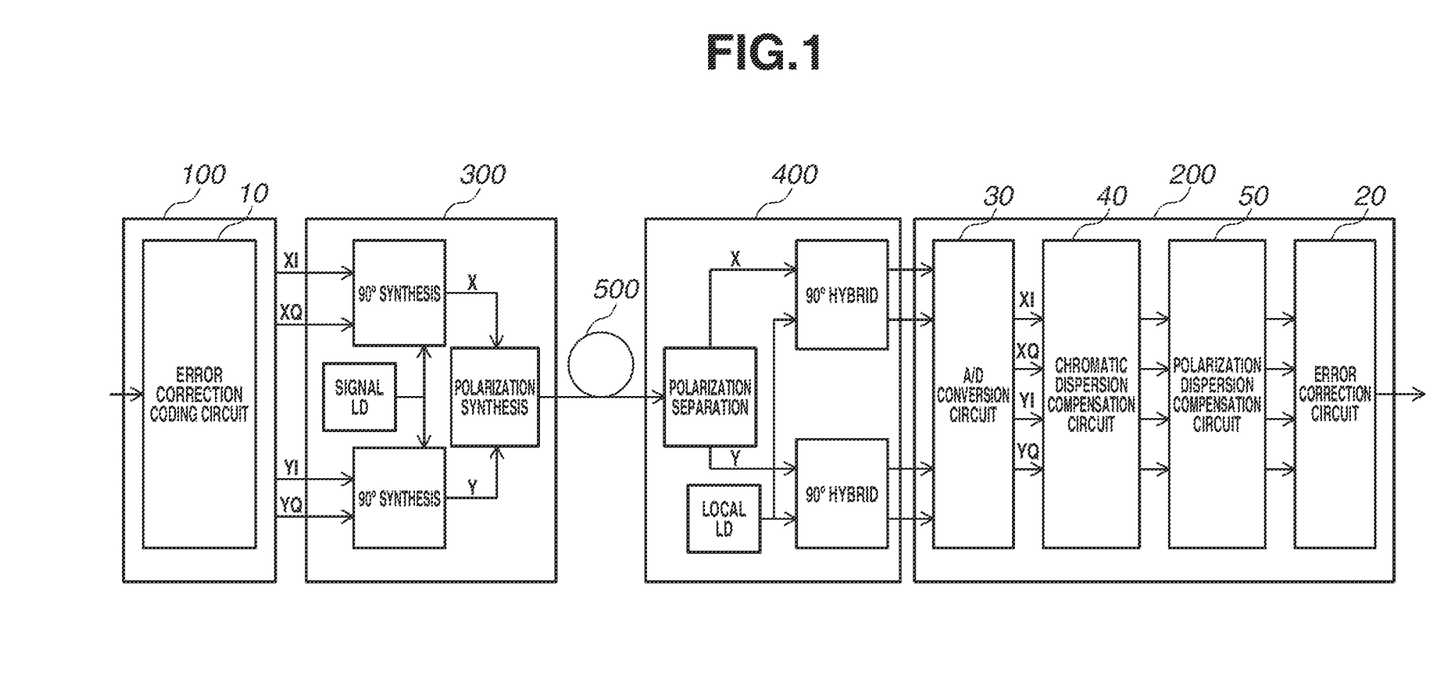
FIG. 1 shows an example of the arrangement of a communication apparatus including an error correction circuit according to an embodiment of the present invention.

FIG. 1 shows an example of the arrangement of a communication apparatus including an error correction circuit according to the embodiment of the present invention. FIG. 1 shows an example in which an error correction circuit 20 according to the embodiment of the present invention is applied to a coherent optical communication type communication apparatus. Note that the application target of the present invention is not limited to the coherent optical communication type communication apparatus, and the present invention is applicable to all other communication apparatuses including wireless communication.

In the coherent optical communication type communication apparatus of FIG. 1, a transmission-side apparatus includes a transmission signal processing circuit 100 and a transmission light module 300, and a reception-side apparatus includes a reception light module 400 and a reception signal processing circuit 200. The transmission signal processing circuit 100 can include an error correction coding circuit 10. The reception signal processing circuit 200 can include an A/D conversion circuit 30, a chromatic dispersion compensation circuit 40, a polarization dispersion compensation circuit 50, and the error correction circuit 20. The transmission-side apparatus and the reception-side apparatus are connected via an optical fiber 500.

The error correction coding circuit 10 in the transmission signal processing circuit 100 performs error correction coding on transmission data. The transmission light module 300 generates an optical signal based on the transmission data having undergone the error correction coding. In general coherent optical communication, a horizontally polarized optical signal X and a vertically polarized optical signal Y are multiplexed and transmitted. The transmission data is divided into horizontally polarized optical signal data (XI and XQ) and vertically polarized optical signal data (YI and YQ).

XI and XQ represent the coordinates, that is, horizontal and orthogonal components of horizontally polarized optical signal data on the horizontal and orthogonal axes on the complex plane, respectively. YI and YQ represent the coordinates, that is, horizontal and orthogonal components of vertically polarized optical signal data on the horizontal and orthogonal axes on the complex plane, respectively. The transmission data is mapped at the coordinates of a carrier wave (signal LD: Laser Diode) on the complex plane, and transmitted to the reception side via the optical fiber 500.

The reception light module 400 generates reception data from the received optical signal. The reception light module 400 can output the horizontally polarized optical signal data (XI and XQ) and the vertically polarized optical signal data (YI and YQ). In the reception signal processing circuit 200, the data (XI, XQ, YI, and YQ) are converted into digital signals by the A/D conversion circuit 30, and these signals are supplied to various compensation circuits. The chromatic dispersion compensation circuit 40 compensates for chromatic dispersion of the supplied signals, the polarization dispersion compensation circuit 50 compensates for polarization dispersion of these signals, and the error correction circuit 20 performs correction processing of a data error.

In the above-described coherent optical communication apparatus, transmission data is transmitted by horizontally and vertically polarized optical signals, but can also be transmitted by only one polarized signal. Even in this case, the error correction circuit 20 according to the embodiment of the present invention can be used.

A communication apparatus capable of using the error correction circuit 20 according to the embodiment of the present invention is not limited to the above-mentioned coherent optical communication apparatus. The error correction circuit 20 according to the embodiment of the present invention can also be used even in other communication apparatuses including wireless communication. Needless to say, such a communication apparatus also falls within the scope of the present invention. Note that only one polarized signal is often used in wireless communication.

<Coding Operation on Transmission Side>

Figure 2A:
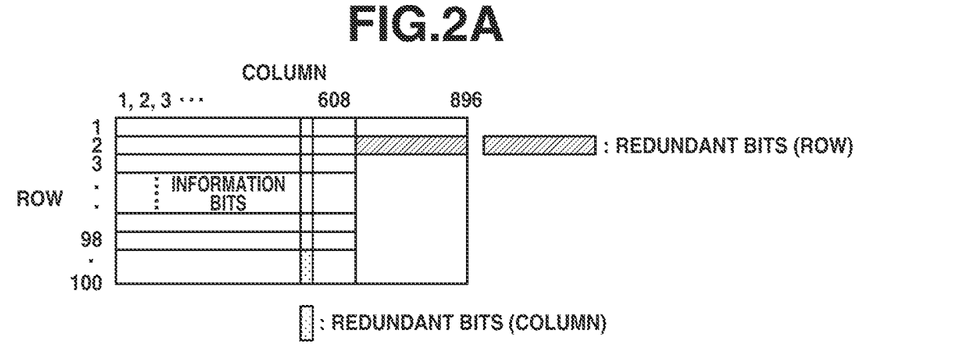
FIG. 2A is a view for explaining a coding operation on the transmission side according to the embodiment of the present invention.
Figure 2B:
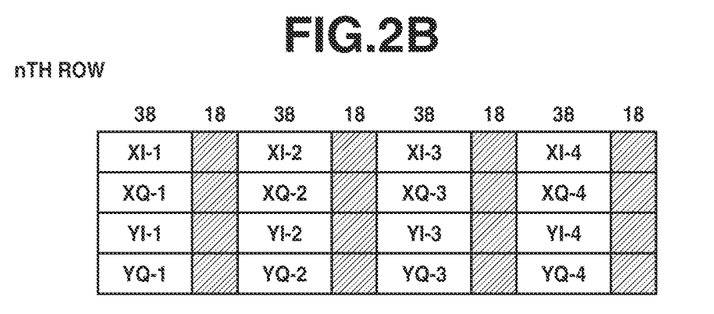
FIG. 2B is a view for explaining the coding operation on the transmission side according to the embodiment of the present invention.
Figure 2C:
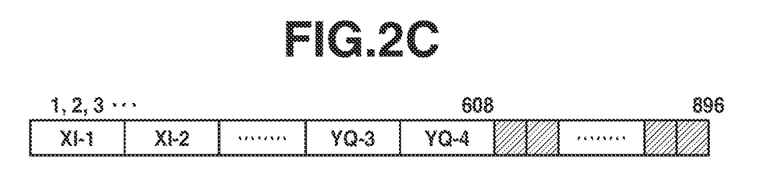
FIG. 2C is a view for explaining the coding operation on the transmission side according to the embodiment of the present invention.
Figure 2D:
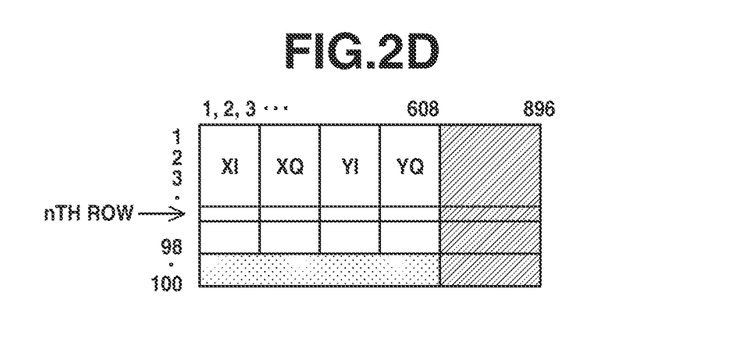
FIG. 2D is a view for explaining the coding operation on the transmission side according to the embodiment of the present invention.

FIGS. 2A to 2D are views for explaining a coding operation on the transmission side according to the embodiment of the present invention. Note that numerical values such as the number of bits shown in FIGS. 2A to 2D are merely an example and the present invention is not limited to these numerical values. FIG. 2A shows an example of the array of transmission data. FIG. 2B shows a configuration example when optical signal data (XI, XQ, YI, and YQ) are applied to one of the rows in FIG. 2A. FIG. 2C shows a configuration example when the configuration example in FIG. 2B is rearranged into one row in FIG. 2A. FIG. 2D shows a configuration example when the optical signal data (XI, XQ, YI, and YQ) are applied to the entire array in FIG. 2A.

In this embodiment, for example, soft decision-based LDPC is available as the first error correction method. In this case, the circuit scale can be reduced by shortening the code length (information bits+redundant bits). As an error correction code for error detection, CRC (Cyclic Redundancy Check), a Hamming code, a BCH code, a Reed-Solomon code, or the like is available. The CRC can be constituted by a circuit much smaller than the soft decision-based LDPC.

In error detection such as CRC, a single or plurality of errors can be detected. Even in error detection, soft decision or hard decision can be used. In general, the error correction capability is higher in the use of soft decision than in the use of hard decision. However, the circuit scale can be reduced more in the use of hard decision.

In the configuration example of FIG. 2A, information bits are arrayed every 608 bits in the row direction on each of 98 rows in the column direction. In error correction coding on the transmission side, first, 2 error detection redundant bits are added to 98 information bits in the column direction, constituting 100 column direction bits for each column. Then, 288 error correction redundant bits are added to 608 bits (information bits (first to 98th rows)) in the row direction and the error detection redundant bits (99th and 100th rows), constituting 896 row direction bits. As result, coding of 100 rows is completed.

In the above-described example, a configuration in which rows and columns are exchanged falls within the scope of the present invention, as a matter of course. Although not shown, it is also possible to first constitute 896 row direction bits by adding 288 error correction redundant bits to 608 information bits (first to 98th rows) in the row direction, and then constitute 100 column direction bits by adding 2 error detection redundant bits to 98 information bits (first to 608th columns) in the column direction and error correction redundant bits (609th to 896th columns).

<Application to XI/XQ/YI/YQ>

Next, a configuration when the array data in FIG. 2A is applied to the horizontally polarized optical signal data (XI and XQ) and the vertically polarized optical signal data (YI and YQ) will be explained with reference to FIGS. 2B to 2D.

FIG. 2B shows a configuration example of XI, XQ, YI, and YQ data strings. Each data string is formed from four minimum frames (XI-1 to XI-4, XQ-1 to XQ-4, YI-1 to YI-4, or YQ-1 to YQ-4), and each minimum frame is formed from 38 information bits and 18 redundant bits. The redundant bit can be generated by LDPC coding of a short code length.

Then, the data strings in FIG. 2B are integrated into information bits and redundant bits in the order of XI/XQ/YI/YQ, as shown in FIG. 2C. As a result, the data strings of one row in FIG. 2A can be constituted by XI information bits×4+XQ information bits×4+YI information bits×4+YQ information bits×4 and XI redundant bits×4+XQ redundant bits×4+YI redundant bits×4+YQ redundant bits×4. After data strings are constituted for 98 rows, the XI, XQ, YI, and YQ data strings are rearranged into a data array as shown in FIG. 2D.

As described above, error detection redundant bits are added for 608 columns in the column direction to XI, XQ, YI, and YQ information bits first arrayed in 608×98, and then error correction redundant bits are added for 100 rows in the row direction. In adding error correction redundant bits, error correction coding is performed on XI, XQ, YI, and YQ data every short code length of the minimum frame (38 information bits+18 redundant bits). Note that the error correction circuit 20 can be shared by performing coding every minimum frame on error detection redundant bits of two, 99th and 100th rows similarly to XI, XQ, YI, and YQ.

<Arrangement of Error Correction Circuit>

Figure 3A:
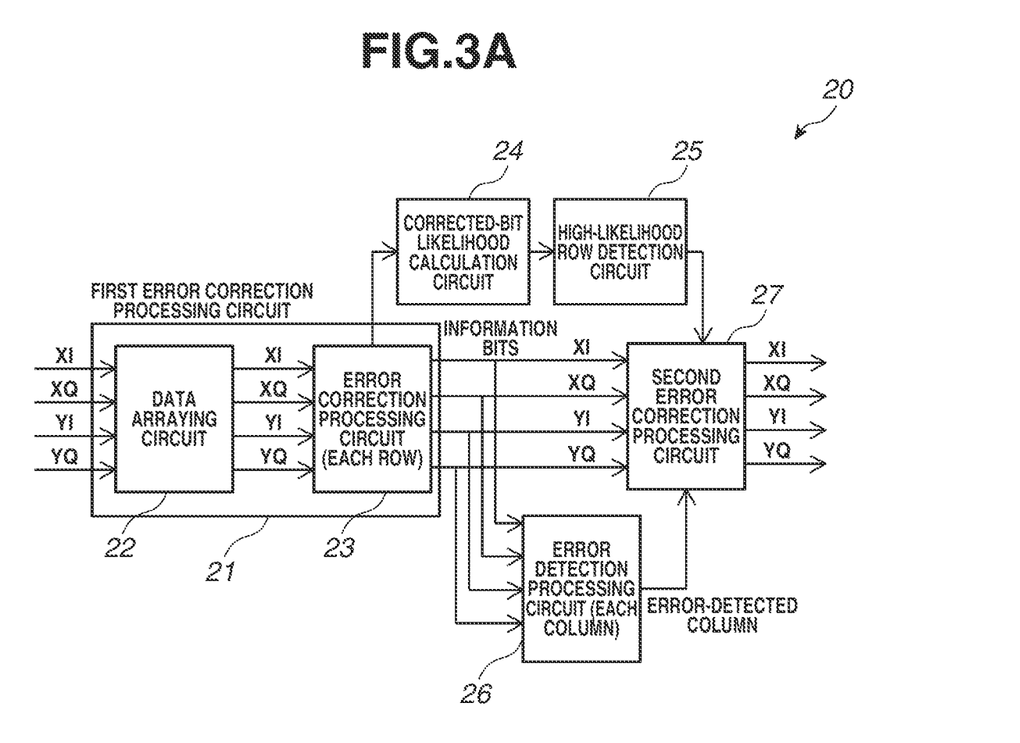
FIG. 3A is a block diagram showing an example of the arrangement of the error correction circuit according to the embodiment of the present invention.

FIG. 3A is a block diagram showing an example of the arrangement of the error correction circuit according to the embodiment of the present invention. The error correction circuit 20 on the reception side includes a first error correction processing circuit 21 including a data arraying circuit 22 and an error correction processing circuit (each row) 23, an error detection processing circuit 26, a second error correction processing circuit 27, a corrected-bit likelihood calculation circuit 24, and a high-likelihood row detection circuit 25.

Figure 3B:
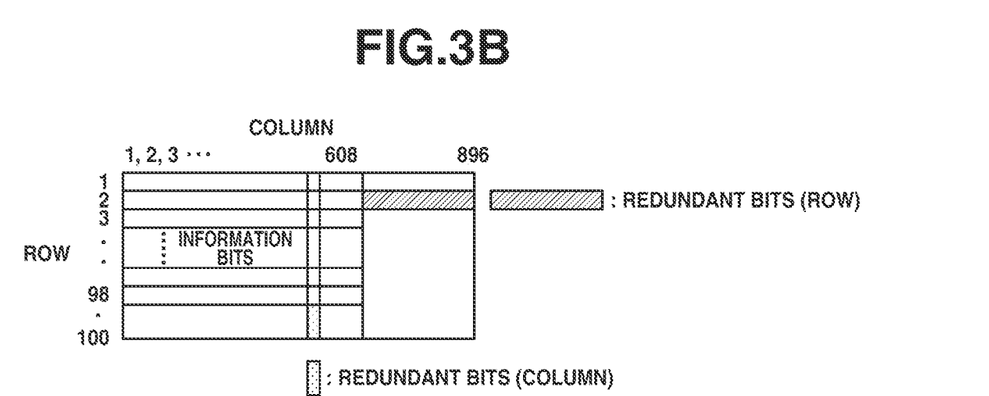
FIG. 3B is a view for explaining the error correction operation of the error correction circuit on the reception side according to the embodiment of the present invention.

The first error correction processing circuit 21 receives reception signals XI, XQ, YI, and YQ from the polarization dispersion compensation circuit 50 shown in FIG. 1. As shown in FIG. 3B, the data arraying circuit 22 arrays these data similarly to a data array constituted on the transmission side. That is, 16 frames of XI×4+XQ×4+YI×4+YQ×4 are constituted every row. One frame has 38 information bits and 18 redundant bits, which is a 56-bit short code length. The configuration of one row is the same as that in FIG. 2C on the transmission side.

<Operation of First Error Correction Processing Circuit>

Figure 4:
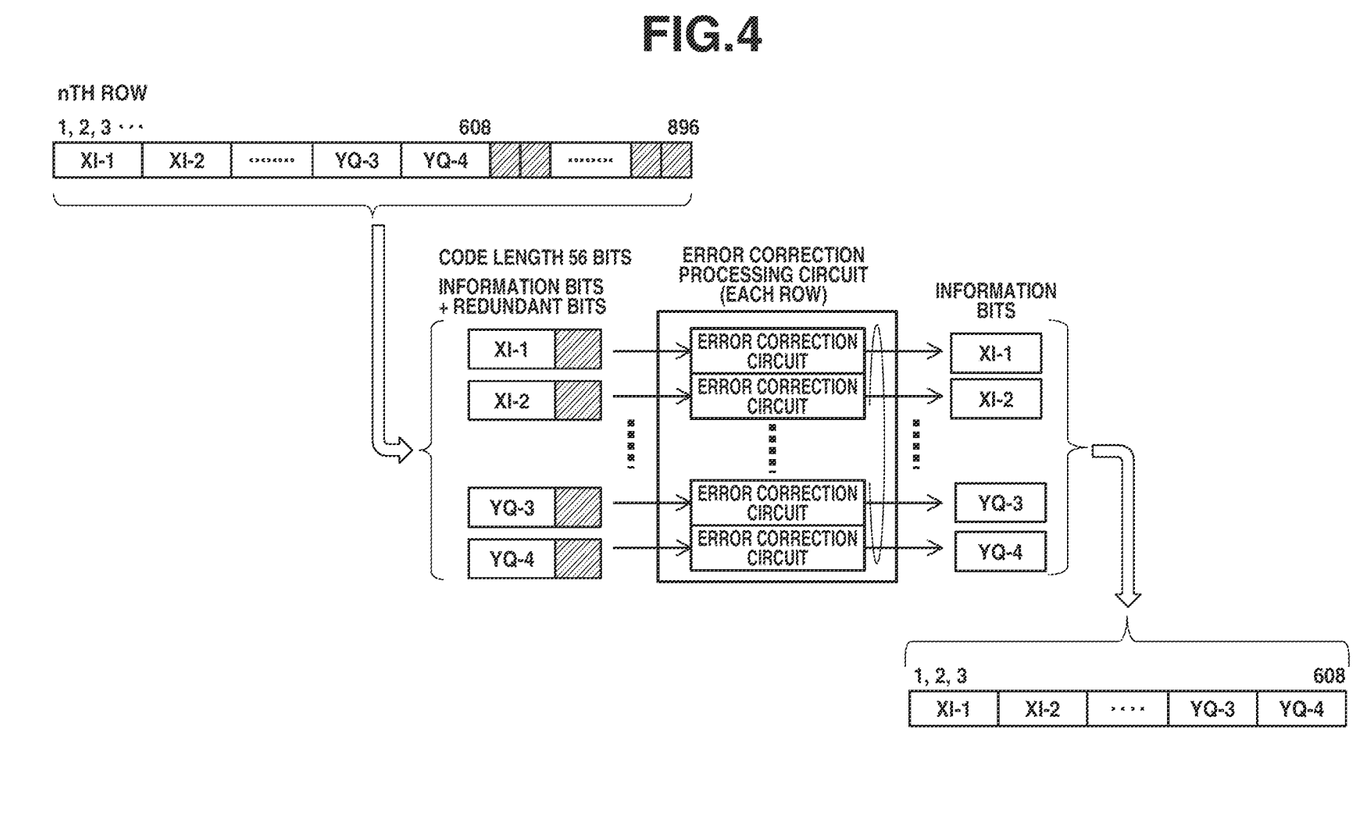
FIG. 4 is a view for explaining the operation of the first error correction processing circuit according to the embodiment of the present invention.

FIG. 4 is a view for explaining the operation of the first error correction processing circuit according to the embodiment of the present invention. The first error correction processing circuit 21 includes 16 error correction circuits, each for the 56-bit code length. Error correction of one row of the data array is performed at once by the 16 correction circuits.

In this configuration example, LDPC is adopted as the first error correction, but the circuit scale can be greatly reduced because of a short code length. Even if 16 circuits are used, the first error correction processing circuit can be constituted at a circuit scale much smaller than a circuit that processes at once a data string (608 information bits+288 redundant bits) to be processed by the 16 circuits.

In high-performance error correction like LDPC, as the code length increases, the circuit scale increases. Thus, by constituting the first error correction processing by a plurality of short-code-length circuits, as shown in FIG. 4, the circuit scale can be reduced to about 1/100 or less. Although the code length in the example of FIG. 4 is 869 bits, the code length can be properly set in accordance with the state of an applied transmission line and the circuit scale of a communication apparatus. The code length in this embodiment is desirably, for example, 1,000 bits or less.

The first error correction processing circuit 21 having the above-described arrangement performs error correction processing sequentially on information bits of 98 rows and error detection redundant bits of two rows, and resultantly outputs data of 608 bits×100 rows.

<Operation of Error Detection Processing Circuit>

Then, the error detection processing circuit 26 performs error detection processing in the column direction on the data of 608 bits×98 rows output from the first error correction processing circuit. In this embodiment, CRC is employed as an error detection method, and error detection of one bit or more is performed every column. The error detection processing circuit 26 outputs information about the columns in which the errors are detected (columns in which the errors are detected and the number of error-detected bits per column).

The hard decision method can be used as the CRC error correction/detection method, and the circuit scale can be reduced compared to a high-performance error correction method (for example, LDPC) using the soft decision method. A plurality of error bits can also be detected. An error can also be detected using a BCH code, a Hamming code, a Reed-Solomon code, or the like for which the circuit scale is smaller than in the soft decision-based LDPC or the like.

<Operation of Corrected-Bit Likelihood Calculation Circuit>

Figure 5:
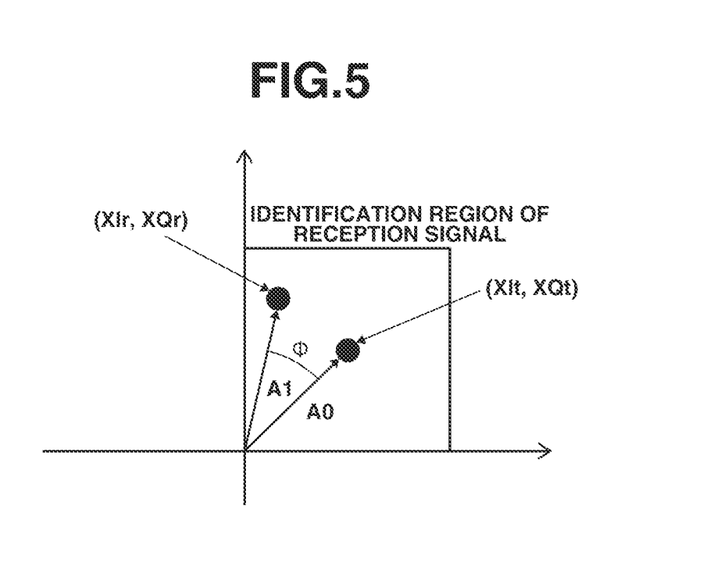
FIG. 5 is a graph for explaining the corrected-bit likelihood according to the embodiment of the present invention.

The corrected-bit likelihood calculation circuit 24 calculates the likelihood of a corrected bit for each row based on corrected bit information from the first error correction processing circuit 21. The likelihood is an index representing the certainty of a bit before correction. FIG. 5 is a graph for explaining the likelihood of a corrected bit. Note that the likelihood for horizontally polarized optical signal data (XI and XQ) is shown in FIG. 5, but this also applies to vertically polarized optical signal data (YI and YQ).

Data input to the first error correction processing circuit 21 is coordinate data on the complex plane such that correction processing targets are (XI and XQ) and (YI and YQ) because the first error correction method is the soft decision method. In the first error correction of the soft decision method, a deviation amount from an ideal coordinate point set on the transmission side is considered in decision.

For a bit corrected in the first error correction processing, the likelihood is represented based on the absolute values of differences between the coordinates (XIr, XQr) and (YIr, YQr) of a reception signal before error correction, and the coordinates (XIt, XQt) and (YIt, YQt) of a constellation set on the transmission side within the identification region of the reception signal. The coordinates (XIt, XQt) and (YIt, YQt) will be referred to as "ideal constellations" or "ideal coordinate points" hereinafter. The coordinates of the ideal constellation are ideal coordinates within the identification region where data may be decided as data after error correction, and are equivalent to mapping coordinates at the time of transmission. In the case of horizontally polarized optical signal data, the likelihood can be represented on the complex plane based on the absolute value of $(XIr-XIt)+j(XQr-XQt)=(A1/A0)\exp(j\phi)$, where A1 is the amplitude of the reception signal before error correction, A0 is the amplitude of the ideal constellation, and $\phi$ is the phase difference between these signals. As for vertically polarized optical signal data, the likelihood can be represented similarly. In error correction, when it is determined that a reception signal is an error, the reception signal is corrected to an ideal signal point in another identification region.

The likelihood is measured by a deviation amount generated by noise or the like from the ideal coordinate point. As the deviation amount is smaller, the "certainty (reliability)" of data is estimated to be higher. The "certainty" is the reproducibility of the ideal coordinate point on the transmission side. The likelihood value and the difference (deviation amount) at coordinates are negatively correlated with each other. In the following description, a high likelihood means a small difference (deviation amount) at coordinates. Since the first error correction processing circuit 21 corrects some bits, the likelihood (corrected-bit likelihood) is calculated, each for all the corrected bits. Further, the sum of the likelihoods of corrected bits is calculated and output for each row of the data array.

The difference (deviation amount) at coordinates serves as the index of the likelihood in the above description, but calculation of the likelihood is not limited to one using the above-described difference at coordinates. For example, the likelihood can also be calculated from only the signal intensity or only the phase difference. The likelihood serving as an index representing the certainty can be generally calculated by various methods, and another index can be used even in the present invention as long as the index represents the certainty. In the present invention, an index other than the coordinate difference can also be used as the likelihood, and this also falls within the scope of the present invention, as a matter of course. The likelihood in the present invention includes even a log likelihood ratio LLR obtained by calculating the log of the ratio of the likelihood.

<Operation of High-Likelihood Row Detection Circuit>

Based on the sum of the likelihoods of corrected bits of respective rows from the corrected-bit likelihood calculation circuit 24, the high-likelihood row detection circuit 25 detects rows in the descending order of the sum.

In general, a bit error is generated when a disturbance such as noise is generally applied to a bit string and exceeds the identification region of each bit. In this case, the bit error is corrected if the number of errors falls within the range of a correctable number. However, if large noise or the like is applied and the number of errors exceeds the correctable number, an uncorrectable bit error is generated. If larger noise or the like is applied, a bit which is originally not an error may be erroneously corrected. In this case, for a data string in a very poor transmission state, it can be estimated that an erroneously corrected bit or an uncorrected bit still exists.

Empirical viewpoint and theoretical examination of the present inventor of the present invention reveal that a data string in a very poor transmission state is estimated to have a large corrected-bit likelihood (small difference at coordinates) described above. It also becomes apparent that the probability at which an erroneously corrected bit or an uncorrected bit exists is estimated to be high in the order of rows having larger sums of the likelihoods of corrected bits. Originally when the likelihood is large, the probability of erroneous correction is estimated to be low. Despite this, a row in which many bits are corrected is estimated to be a row for which the transmission state is very poor. According to the present invention, as the second error correction processing, erroneously detected bits are corrected in the order of rows having larger likelihoods to perform additional error correction on an erroneously corrected bit or an uncorrected bit in the first error correction processing, thereby compensating for the first error correction processing. Note that, as described above, the likelihood is not limited to the above-mentioned difference at coordinates, and another index can be used as long as the index represents the certainty.

<Operation of Second Error Correction Processing Circuit>

Figure 6A:
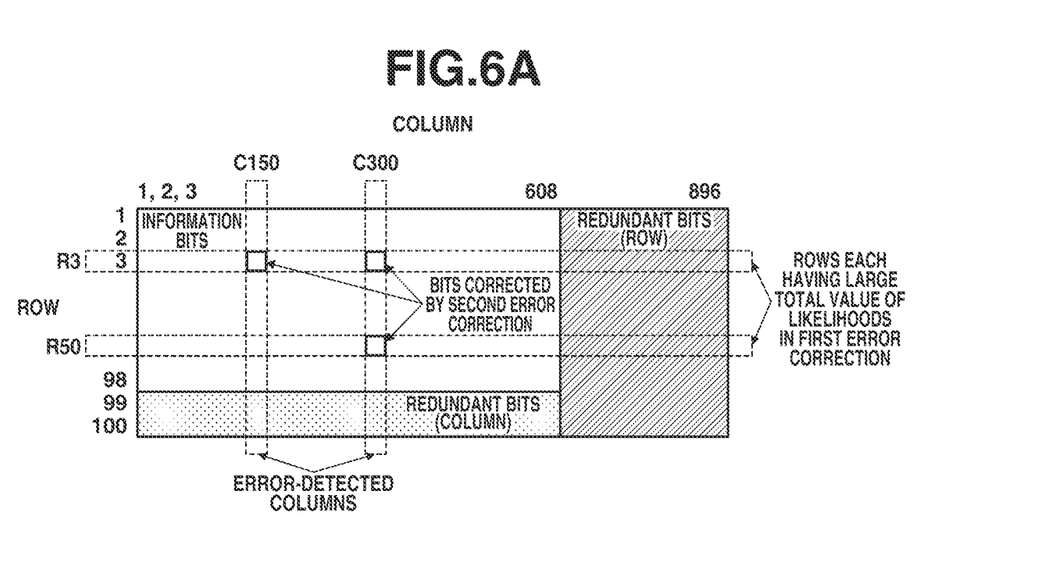
FIG. 6A is a view for explaining the operation of the second error correction processing circuit according to the embodiment of the present invention.
Figure 6B:
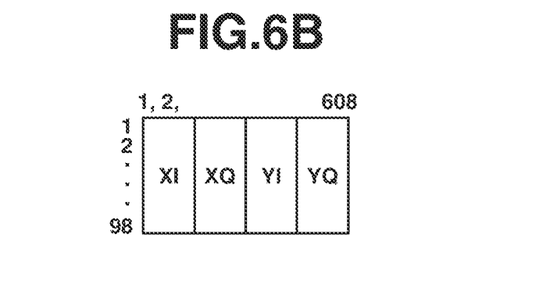
FIG. 6B is a view for explaining the operation of the second error correction processing circuit according to the embodiment of the present invention.

FIGS. 6A and 6B are views for explaining the operation of the second error correction processing circuit 27 according to the embodiment of the present invention. The second error correction processing circuit 27 performs additional error correction based on the columns in which the errors are detected and the number of error-detected bits per column, which are sent from the error detection processing circuit 26, and the order of rows detected by the high-likelihood row detection circuit 25. More specifically, the second error correction processing circuit 27 performs, by the number of detected bits in the order of rows having larger sums of likelihoods, correction, that is, bit inversion on bits at each of which a column error-detected by the error detection processing circuit 26 and a row selected by the high-likelihood row detection circuit 25 cross each other.

In FIG. 6A, it is assumed that the high-likelihood row detection circuit 25 detects the third row (R3) as the first detected row and the 50th row (R50) as the second detected row as a result of performing error correction processing for the respective first to 100th rows by the first error correction processing circuit 21. Rn represents the nth row (row).

Then, it is assumed that the error detection processing circuit 26 detects a 1-bit error on the 150th column (C150) and a 2-bit error on the 300th column (C300) as a result of performing error detection processing for the respective first to 608th columns. Cn represents the nth column (column).

In this case, a bit at an intersection point between the 150th column (C150) and the third row (R3), and two bits at intersection points between the 300th column (C300) and the third row (R3) and 50th row (R50) are corrected. A case in which the error detection processing circuit 26 can detect an error of three bits or more also falls within the scope of the present invention. In this case, the second error correction processing is performed in accordance with the number of detected error bits.

As shown in FIG. 6B, information bits corrected by the second error correction processing circuit 27 are output as XI/XQ/YI/YQ data on 608 columns×98 rows, respectively. The second error correction processing circuit 27 can easily correct, by the second error correction using error detection much simpler than the first error correction, an erroneously corrected bit or an uncorrected bit in the first error correction.

According to this embodiment, the first error correction processing can be compensated by performing additional error correction on a bit estimated to be erroneously corrected or not corrected yet in the first error correction. A combination of the first error correction having high correction capability and the second error correction using simple error detection can implement an error correction circuit capable of improving transmission characteristics while suppressing the circuit scale. When error correction is executed double, like conventional concatenated coding, complicated calculation of error correction is performed using the coordinates of a reception signal as likelihood information even in the second error correction processing.

To the contrary, according to the present invention, the likelihood is used for estimation of a row in a poor transmission state, and simple hard decision processing can be used for calculation of error detection processing. Since the likelihood is used for detection of a poor row, error correction capability at soft decision processing level can be obtained as a whole. Hence, equivalent error correction capability can be implemented by a smaller circuit scale. The circuit scale can be further reduced by greatly shortening the code length in the first error correction.

<Operation of Error Correction Method>

Figure 7:
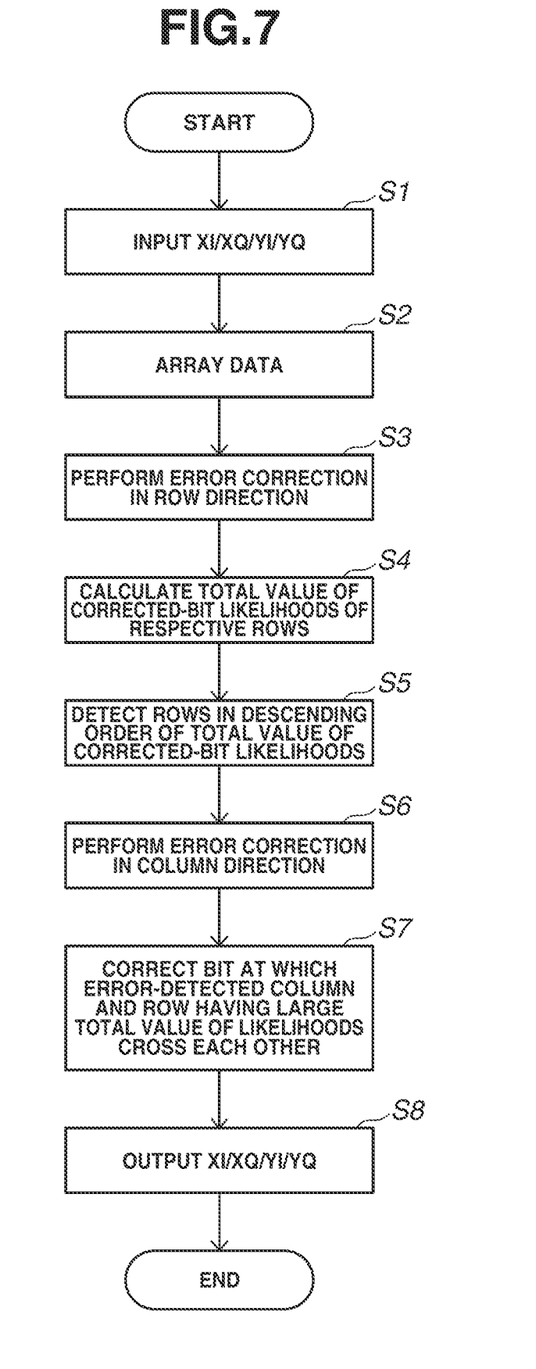
FIG. 7 is a flowchart for explaining the operation of an error correction method according to the embodiment of the present invention.

FIG. 7 is a flowchart for explaining the operation of the error correction method according to the embodiment of the present invention. The error correction method according to this embodiment is executed in the error correction circuit 20 including the first error correction processing circuit, the error detection processing circuit, the second error correction processing circuit, the corrected-bit likelihood calculation circuit, and the high-likelihood row detection circuit.

When a reception signal XI/XQ/YI/YQ is input to the first error correction processing circuit 21 (step S1), the data arraying circuit 22 arrays data similarly to a data array constituted on the transmission side (step S2).

The error correction processing circuit (each row) 23 performs the first error correction processing in the row direction on the array data obtained by the data arraying circuit 22 (step S3).

The corrected-bit likelihood calculation circuit 24 calculates likelihoods for bits corrected by the first error correction processing circuit, based on the absolute values of differences between the coordinates of the reception signal of each bit before correction on the complex plane and the coordinates of an ideal constellation set on the transmission side on the complex plane, and outputs the total value of the calculated likelihoods of the corrected bits (step S4). The high-likelihood row detection circuit 25 detects rows of the array data in the descending order of the total value of the likelihoods of the corrected bits on each row from the corrected-bit likelihood calculation circuit 24 (step S5).

For the bits corrected by the first error correction processing circuit 21, the error detection processing circuit 26 performs error detection processing of at least one bit in the column direction on the array data coded in the column direction on the transmission side (step S6).

If an error of one bit or more is detected in the error detection processing circuit 26, the second error correction processing circuit 27 corrects, in the order of rows having larger sums of the likelihoods of the corrected bits, a bit at which a column in which an error is detected and a row output from the corrected-bit likelihood calculation circuit cross each other (step S7). The sum of likelihoods represents the total value of numerical values (likelihoods) on a row representing the certainty of each corrected bit before correction.

The second error correction processing circuit 27 outputs the corrected information bits as XI/XQ/YI/YQ data (step S8).

OTHER EMBODIMENTS

In the above description, based on the sum of the likelihoods of corrected bits of respective rows from the corrected-bit likelihood calculation circuit 24, the high-likelihood row detection circuit 25 detects rows in the descending order of the sum. However, a similar arrangement can be implemented without the high-likelihood row detection circuit. In this case, when columns in which errors are detected and the number of error-detected bits per column are input from the error detection processing circuit 26, the second error correction processing circuit 27 may perform correction in the descending order of the sum of the likelihoods of corrected bits of respective rows output from the corrected-bit likelihood calculation circuit 24.

Since the sum of the likelihoods of corrected bits used in the second error correction processing circuit 27 is represented by the total value of the absolute values of differences of reception signals at coordinates, the data range becomes wide and a large memory amount and circuit scale are sometimes required. In this case, the necessary circuit scale can be reduced by standardizing the total value of the likelihoods of corrected bits. For example, letting x be the corrected-bit likelihood, the total value is converted using $y=(a-x)/b$ ($a$ and b are predetermined values) and y after conversion can be standardized to take 0 to 1. In this equation, a and b can be properly set in accordance with a possible value of the total value x of the likelihoods of corrected bits.

By standardizing the total value of the likelihoods of corrected bits, the data width can be restricted to the standardized range and the circuit scale of a memory or the like for storing the total value of likelihoods can be reduced. The circuit scale of the entire error correction circuit can be further reduced by using the standardized value y instead of a row detected by the high-likelihood row detection circuit 25 when performing the second error correction processing. Note that since the standardized value y also represents the likelihood, even the second error correction processing can be regarded as soft decision processing and improve the correction capability in comparison with hard decision processing.

INDUSTRIAL APPLICABILITY

The present invention can be used as an error correction circuit and a communication apparatus in optical communication and the like.

EXPLANATION OF THE REFERENCE NUMERALS AND SIGNS

100 . . . transmission signal processing circuit, 200 . . . reception signal processing circuit, 300 . . . transmission light module, 400 . . . reception light module, 10 . . . error correction coding circuit, 20 . . . error correction circuit, 21 . . . first error correction processing circuit, 22 . . . data arraying circuit, 23 . . . error correction processing circuit (each row), 24 . . . corrected-bit likelihood calculation circuit, 25 . . . row detection circuit, 26 . . . error detection processing circuit, 27 . . . second error correction processing circuit, 30 . . . A/D conversion circuit, 40 . . . chromatic dispersion compensation circuit, 50 . . . dispersion compensation circuit

The invention claimed is:

1. An error correction circuit comprising:
a first error correction processing circuit configured to generate array data by arranging data of a reception signal in a row direction and a column direction and perform error correction processing in the row direction, a first coding being performed in the row direction on a transmission side, a second coding being performed in the column direction on the transmission side;

an error detection processing circuit configured to perform error detection processing in the column direction on the array data to detect an error of at least one bit;
a corrected-bit likelihood calculation circuit configured to calculate a sum of likelihoods for each row, the likelihood being an index of certainty of a bit before correction regarding the bit corrected by the first error correction processing circuit;
a high-likelihood row detection circuit configured to detect rows of the array data in a descending order of sums of likelihoods of corrected bits of respective rows output from the corrected-bit likelihood calculation circuit; and
a second error correction processing circuit configured to, when the error detection processing circuit detects the error of at least one bit, correct a bit at which a column in which an error is detected and a row detected by the high-likelihood row detection circuit cross each other in an order of the rows having larger sums of likelihoods detected by the high-likelihood row detection circuit by bit inversion based on the number of detected error bits detected by the error detection processing circuit,
wherein the likelihood of the corrected bit is calculated based on absolute values of differences between coordinates of the reception signal before correction on a complex plane and coordinates of a constellation set on the transmission side on the complex plane within an identification region of the reception signal, a ratio between an amplitude of the reception signal and an amplitude of the constellation, or phase difference between the reception signal and the constellation.

2. The error correction circuit according to claim 1, wherein the sum of likelihoods of corrected bits is standardized.

3. The error correction circuit according to claim 1, wherein the first error correction processing circuit performs error correction by soft decision, and the error detection processing circuit performs error detection by hard decision.

4. The error correction circuit according to claim 1, wherein the array data is formed from horizontally polarized optical signal data and vertically polarized optical signal data of a coherent optical communication method.

5. The error correction circuit according to claim 1, wherein the first coding is performed in units of not more than 1,000 bits.

6. A communication apparatus comprising an error correction circuit according to claim 1.

7. An error correction circuit comprising:
a first error correction processing circuit configured to generate array data by arranging data of a reception signal in a row direction and a column direction and perform error correction processing in the row direction, a first coding being performed in the row direction on a transmission side, a second coding being performed in the column direction on the transmission side;
an error detection processing circuit configured to perform error detection processing in in the column direction on the array data to detect an error of at least one bit;
a corrected-bit likelihood calculation circuit configured to calculate a sum of likelihoods for each row, the likelihood being an index of certainty of a bit before correction regarding the bit corrected by the first error correction processing circuit; and
a second error correction processing circuit configured to, when the error detection processing circuit detects the error of at least one bit, perform error correction, in an order of the rows having larger sums of the likelihoods of corrected bits, on a bit at which a column in which an error is detected and the rows each other by bit inversion based on the number of detected error bits detected by the error detection processing circuit,
wherein the likelihood of the corrected bit is calculated based on absolute values of differences between coordinates of the reception signal before correction on a complex plane and coordinates of a constellation set on the transmission side on the complex plane within an identification region of the reception signal, a ratio between an amplitude of the reception signal and an amplitude of the constellation, or phase difference between the reception signal and the constellation.

8. The error correction circuit according to claim 7, wherein the likelihood of a corrected bit is calculated based on absolute values of differences between coordinates of a reception signal before correction on a complex plane and coordinates of a constellation set on the transmission side on the complex plane within an identification region of the reception signal.

9. The error correction circuit according to claim 7, wherein the sum of likelihoods of corrected bits is standardized.

10. The error correction circuit according to claim 7, wherein the first error correction processing circuit performs error correction by soft decision, and the error detection processing circuit performs error detection by hard decision.

11. The error correction circuit according to claim 7, wherein the array data is formed from horizontally polarized optical signal data and vertically polarized optical signal data of a coherent optical communication method.

12. The error correction circuit according to claim 7, wherein the first coding is performed in units of not more than 1,000 bits.

13. A communication apparatus comprising an error correction circuit according to claim 7.

14. An error correction method executed in an error correction circuit including a first error correction processing circuit, an error detection processing circuit, a second error correction processing circuit, and a corrected-bit likelihood calculation circuit, the method comprising steps of:
causing the first error correction processing circuit to generate array data by arranging data of a reception signal in a row direction and a column direction and perform error correction processing in the row direction, a first coding being performed in the row direction on a transmission side, a second coding being performed in the column direction on the transmission side;
causing the error detection processing circuit to perform error detection processing of at least one bit in the column direction on the array data;
causing the corrected-bit likelihood calculation circuit to calculate a likelihood of corrected bits, the likelihood being an index representing certainty of a bit before correction regarding the bit corrected by the first error correction processing circuit, and output a sum of calculated likelihoods of corrected bits for each row of the array data, the corrected bit being a bit corrected by the first error correction processing circuit; and
causing the second error correction processing circuit to, when the error detection processing circuit detects the error of at least one bit, correct, in an order of the rows having larger sums of the likelihoods of corrected bits, a bit at which a column in which an error is detected and the rows each other by bit inversion based on the number of detected error bits detected by the error detection processing circuit, wherein the likelihood of the corrected bit is calculated based on absolute values of differences between coordinates of the reception signal before correction on a complex plane and coordinates of a constellation set on the transmission side on the complex plane within an identification region of the reception signal, a ratio between an amplitude of the reception signal and an amplitude of the constellation, or phase difference between the reception signal and the constellation.

* * * * *